United States Patent
Gutman et al.

(10) Patent No.: US 12,100,574 B2
(45) Date of Patent: Sep. 24, 2024

(54) TARGET AND ALGORITHM TO MEASURE OVERLAY BY MODELING BACK SCATTERING ELECTRONS ON OVERLAPPING STRUCTURES

(71) Applicant: KLA CORPORATION, Milpitas, CA (US)

(72) Inventors: Nadav Gutman, Zichron Ya'aqov (IL); Oliver Ache, Leun (DE); Carey Phelps, Hillsboro, OR (US)

(73) Assignee: KLA Corporation, Milpitas, CA (US)

( * ) Notice: Subject to any disclaimer, the term of this patent is extended or adjusted under 35 U.S.C. 154(b) by 1120 days.

(21) Appl. No.: 16/918,242

(22) Filed: Jul. 1, 2020

(65) Prior Publication Data
US 2022/0005668 A1   Jan. 6, 2022

(51) Int. Cl.
| | |
|---|---|
| H01J 37/22 | (2006.01) |
| G03F 7/00 | (2006.01) |
| H01J 37/20 | (2006.01) |
| H01J 37/244 | (2006.01) |
| H01J 37/28 | (2006.01) |

(52) U.S. Cl.
CPC ........ *H01J 37/222* (2013.01); *G03F 7/70633* (2013.01); *G03F 7/70683* (2013.01); *H01J 37/20* (2013.01); *H01J 37/244* (2013.01); *H01J 37/28* (2013.01); *H01J 2237/24475* (2013.01); *H01J 2237/24578* (2013.01)

(58) Field of Classification Search
CPC ........ H01J 37/222; H01J 37/20; H01J 37/244; H01J 37/28; H01J 2237/24475; H01J 2237/24578; H01J 2237/30444; G03F 7/70633; G03F 7/70683
See application file for complete search history.

(56) References Cited

U.S. PATENT DOCUMENTS

| | | | |
|---|---|---|---|
| 7,068,833 B1 | 6/2006 | Ghinovker et al. | |
| 7,274,814 B2 | 9/2007 | Ghinovker et al. | |
| 8,330,281 B2 | 12/2012 | Ghinovker et al. | |
| 9,214,317 B2 | 12/2015 | Shur | |
| 9,476,698 B2 | 10/2016 | Abdulhalim et al. | |

(Continued)

FOREIGN PATENT DOCUMENTS

| | | | | |
|---|---|---|---|---|
| CN | 111324019 A | 6/2020 | | |
| JP | 11111594 A | * 4/1999 | ........... | G03F 7/7045 |

OTHER PUBLICATIONS

Adel, M., et al; "Diffraction order control in overlay metrology: a review of the roadmap options," Proc. SPIE 6922, Metrology, Inspection, and Process Control for Microlithography XXII, 692202 (Mar. 14, 2008); https://doi.org/10.1117/12.773243 (Year: 2008).*

(Continued)

*Primary Examiner* — David E Smith
*Assistant Examiner* — Christopher J Gassen
(74) *Attorney, Agent, or Firm* — Hodgson Russ LLP

(57) ABSTRACT

An overlay target includes a grating-over-grating structure with a bottom grating structure disposed on a specimen and a top grating structure disposed on the bottom grating structure. The overlay target further includes a calibration scan location including the bottom grating structure but not the top grating structure and an overlay scan location including the top grating structure and the bottom grating structure.

9 Claims, 8 Drawing Sheets

(56) References Cited

U.S. PATENT DOCUMENTS

| | | | |
|---|---|---|---|
| 9,478,395 B1* | 10/2016 | Monahan | G03F 9/7076 |
| 2004/0019861 A1 | 1/2004 | Li | |
| 2007/0008533 A1 | 1/2007 | Ghinovker | |
| 2013/0035888 A1 | 2/2013 | Kandel et al. | |
| 2014/0060148 A1 | 3/2014 | Amit et al. | |
| 2015/0186581 A1* | 7/2015 | Chen | G03F 7/70625 |
| | | | 716/54 |
| 2018/0033590 A1* | 2/2018 | Zhuang | G03F 7/70683 |
| 2018/0373167 A1 | 12/2018 | Grunzweig et al. | |
| 2019/0004439 A1 | 1/2019 | Lubashevsky et al. | |
| 2019/0178639 A1 | 6/2019 | Gutman et al. | |
| 2019/0279841 A1 | 9/2019 | Xiao | |
| 2019/0354024 A1 | 11/2019 | Tsiatmas et al. | |
| 2020/0388462 A1* | 12/2020 | Nguyen | H01J 37/222 |
| 2021/0018850 A1* | 1/2021 | Slachter | G03F 7/70558 |

OTHER PUBLICATIONS

Amir, N., et al; "Multi layer overlay measurement recent developments," Proc. SPIE 8681, Metrology, Inspection, and Process Control for Microlithography Xxvii, 86812V (Apr. 10, 2013); https://doi.org/10.1117/12.2025865; (Year: 2013).*

Bringoltz, B., et al; "Accuracy in optical overlay metrology," Proc. SPIE 9778, Metrology, Inspection, and Process Control for Microlithography Xxx, 97781H (Mar. 24, 2016); https://doi.org/10.1117/12.2219176 (Year: 2016).*

WIPO, International Search Report for International Application No. PCT/US2021/039735, Oct. 26, 2021.

* cited by examiner

TARGET AND ALGORITHM TO MEASURE OVERLAY BY MODELING BACK SCATTERING ELECTRONS ON OVERLAPPING STRUCTURES

FIELD OF THE DISCLOSURE

The disclosure generally relates to semiconductor targets and metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Standard marks used for electron beam overlay measurement may have separated patterns that allow for signals originating from different layers to be detached in a non-overlapping manner, as shown in FIG. 1 as side-by-side marks and in FIG. 2 as interleaved marks. In such cases, simple algorithms may be used to extract the positions of each layer.

FIGS. 3 and 4 illustrate multi-layer patterns 1 comprising top layer 2 and buried layer 3. Where there are multiple layers, there may be an inability to distinguish whether a secondary electron signal corresponds to secondary electrons 4 from the top layer 2, which may be denoted as SE, or secondary electrons 5 from the buried layer 3, which may be denoted as SE2. As illustrated in FIG. 3, SE2 may correspond to secondary electrons 5 generated from backscattered electrons that scatter from the buried layer 3. Similarly, there may be an inability to determine whether the backscattered electron (BSE) signal 6 or 7 corresponds to the top layer 2 or a buried layer 3, as illustrated in FIG. 4.

There may be disadvantages in measuring spatially separated targets. Such disadvantages may include having large open areas. Open areas are not compatible with microelectronics fabrication because they increase costs. Another disadvantage may be that imaging using electron beam on asymmetric field of views can create beam placement distortion due to uneven charging of the surface. Additionally, separated areas may not adequately represent the device, which may comprise stacked layers.

One previous attempt to avoid these disadvantages (i.e., to measure stacked layers where no spatial separation of the signals from each layer is possible) included modeling the electron beam stack interaction. However, full modeling requires knowledge of the design, process steps, and tool-material interaction. In such attempts, this is performed using optical measurements, for example, optical critical dimension (OCD) applications. For electron beam overlay metrology, there is no accurate and fast metrology method.

Another previous attempt included constructing dedicated grating-over-grating targets with a designated shift. Such construction may incorporate algorithms that use differential signals. As the signal-to-noise ratio (SNR) is an order of magnitude smaller than spatially separated features, the required measurement time becomes long, which makes such targets not viable for in-line production control.

Therefore, improved overlay targets and methods of measuring the same are needed.

SUMMARY OF THE DISCLOSURE

In an embodiment, an overlay target may comprise a grating-over-grating structure, a calibration scan location, and an overlay scan location.

In another embodiment, a method may comprise acquiring an overlay target with an electron beam-based output acquisition subsystem thereby forming an acquisition image and measuring an overlay of the grating-over-grating structure using the acquisition image. The overlay target may comprise a grating-over-grating structure, a calibration scan location, and an overlay scan location. Measuring the overlay of the grating-over-grating structure using the acquisition image may comprise solving and extracting the overlay from the acquisition image.

In an instance, a non-transitory computer-readable storage medium may comprise one or more programs for executing the steps of the method, e.g., acquiring an overlay target with an electron beam-based output acquisition subsystem thereby forming an acquisition image and measuring an overlay of the grating-over-grating structure using the acquisition image. The steps may further include solving and extracting the overlay from the acquisition image.

In an instance, a system may comprise a stage, an electron beam-based output acquisition subsystem, and a processor in electronic communication with the electron beam-based output acquisition subsystem. The stage may be configured to hold a specimen having an overlay target. The overlay target may comprise a grating-over-grating structure, a calibration scan location, and an overlay scan location. The processor may be configured to measure an overlay of the grating-over-grating structure using the acquisition image. The processor may be further configured to measure an overlay of the grating-over-grating structure using the acquisition image by solving and extracting the overlay from the acquisition image.

The grating-over-grating structure may include a bottom grating structure and a top grating structure. The bottom grating structure may be disposed on a specimen. The specimen may be on a stage. The top grating structure may be disposed on the bottom grating structure. Both the top grating structure and bottom grating structure may be part of the specimen, which may be a semiconductor wafer or other type of specimen. The calibration scan location may include the bottom grating structure but not the top grating structure. In some embodiments, the calibration scan location may consist essentially of the bottom grating structure. The overlay scan location may include the bottom grating structure and the top grating structure.

The grating-over-grating structure may include an open area. The open area may include neither the bottom grating structure nor the top grating structure.

The solving and extracting may comprise extracting an extracted signal from a single layer. The method may further comprise improving a signal-to-noise ratio of the extracted signal. The improving may comprise applying a design-based filter to the extracted signal. Solving and extracting may further comprise solving a scattering of the extracted signal.

Solving the scattering may comprise applying a backscattered electron profile to the extracted signal, determining a transfer function for the extracted signal, and generating a model for the scattering comprising the transfer function.

A parameter of the model may be optimized using a center of symmetry of the secondary electron signal or a local asymmetry. A parameter of the model may be optimized by matching the calibration scan location with a second calibration scan location for which an interaction between backscattered electrons and secondary electrons of a specific layer can be found.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Figure 1:
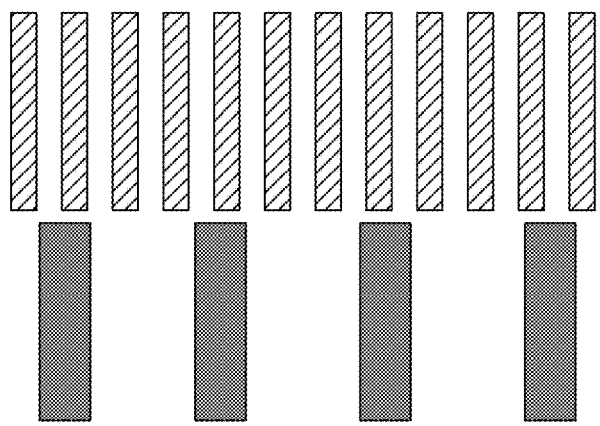
FIG. 1 illustrates a previous target design.
Figure 2:
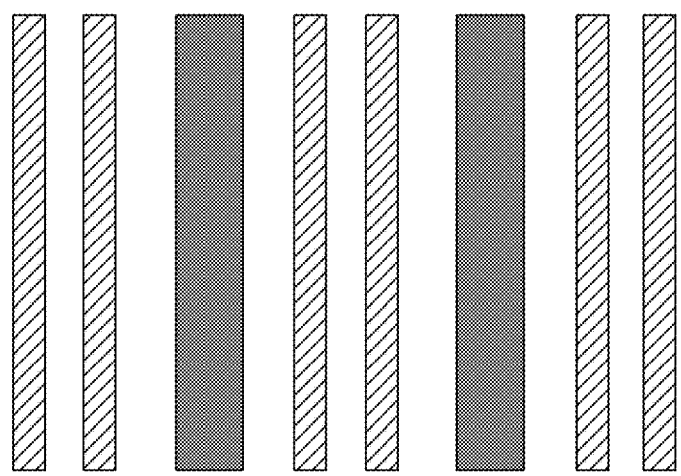
FIG. 2 illustrates a previous target design.
Figure 3:
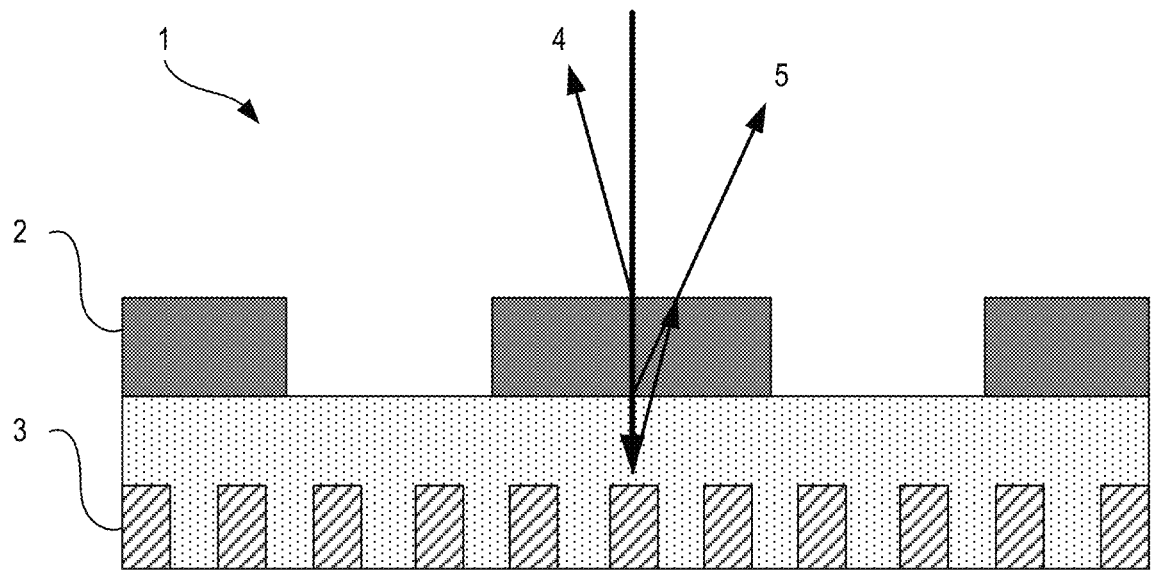
FIG. 3 illustrates a previous target design.
Figure 4:
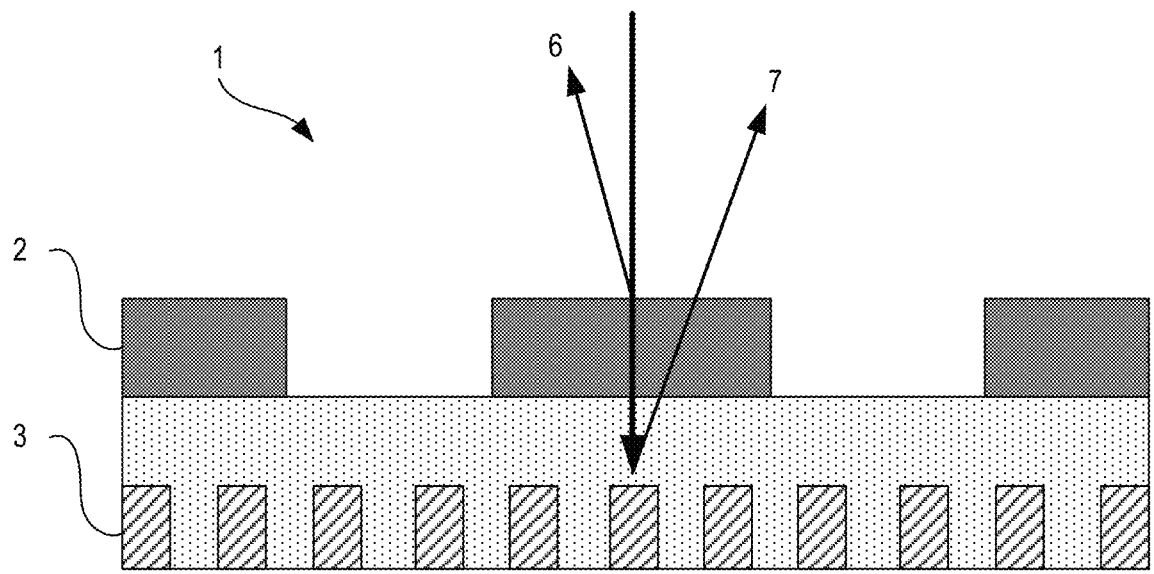
FIG. 4 illustrates a previous target design.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments may include improvements to overlay (i.e., misregistration) measurements using electron beam (e-beam) metrology tools. Such electron beam metrology tools may include critical dimension scanning electron microscopy (CD-SEM), defect/defect review, or inspection tools. Dedicated targets and algorithms may be applied to complex semiconductor stacks to overcome accuracy errors resulting from a mixing of signals from multiple layers.

In electron beam metrology, an image may be constructed by scanning a focused electron beam on a target (e.g., using a scanning electron microscope (SEM)). Two types of electrons may be captured from each scan point using single or multiple detectors to create an image. These two types of electrons include backscattered electrons (BSEs) and secondary electrons (SEs). When constructing an image from multi-layered structures, such as those used for misregistration or overlay measurement, the two sets of electrons may be generated from all layers making contact with the beam.

In an instance, an embodiment target may be optimal for metrology performance in terms of total measurement uncertainty (TMU) and inaccuracy resulting from target-to-device biases. Even in the case of targets optimized for short measurement time and lower TMU, measured overlay values may differ from the semiconductor device. This bias may be referred to as target inaccuracy or non-zero overlay (NZO). To overcome this bias, an embodiment target may have features similar to the device (e.g., stacked layers and a small pitch).

The challenges posed by targets similar to devices includes, for instance, overcoming signal contamination without needing spatial separation. Such complex interactions may not be practical to model analytically, as is done for optical interactions. Embodiments according to the instant claims can overcome these challenges.

In an instance, an algorithm may provide the interaction between SEs as described by Equation 1.

$$SE(x)=SE_1(x)+SE_2(x+x_2) \qquad [1]$$

In Equation 1, x represents the position along the target, $x_2$ is the offset of the second grating (e.g., the overlay), SE represents the detected secondary electrons from the top ($SE_1$) and bottom ($SE_2$) layers. If the position of the second layer can be measured with sufficient precision, it can serve as an input. Sufficient precision can be where clear enough signals are captured to overcome the noise and so that the position of the grating is measured. Nevertheless, the position of the second layer need not be an input and may be calculated according to embodiments of the present disclosure. For example, the position of the second layer can be calculated if the position of one grating is known or if the position of one grating is not known.

Embodiments herein may overcome signal contamination by modeling the secondary electron signals using knowledge of the secondary electrons ($SE_2$) and backscattered electrons ($BSE_2$) from the buried layer. $\alpha$, $\gamma$, and the function f are scattering coefficient that transfer signal from layer-to-layer using the electrons.

$$SE(x)=SE_1(x)+\alpha BSE_2(x+x_2) \qquad [2]$$

$$SE(x)=SE_1(x)+\gamma SE_1(x)BSE_2(x+x_2) \qquad [3]$$

$$SE(x)=SE_1(x)+f(SE_1(x),BSE(x+x_2)) \qquad [4]$$

Where each of Equations 2-4 represent a growing complexity of interactions, have more variables, or are more sensitive. All rely on the ability to leverage dedicated areas in the target where both the $BSE_2$ and $SE_2$ profiles can be clearly measured.

To solve this set of equations, a target includes or consists of at least one area where one of the two layers is not contaminated. Examples of such a target design can be found in FIGS. 5-7.

In an instance, an overlay target may comprise a grating-over-grating structure, a calibration scan location, and an overlay scan location.

Figure 5:
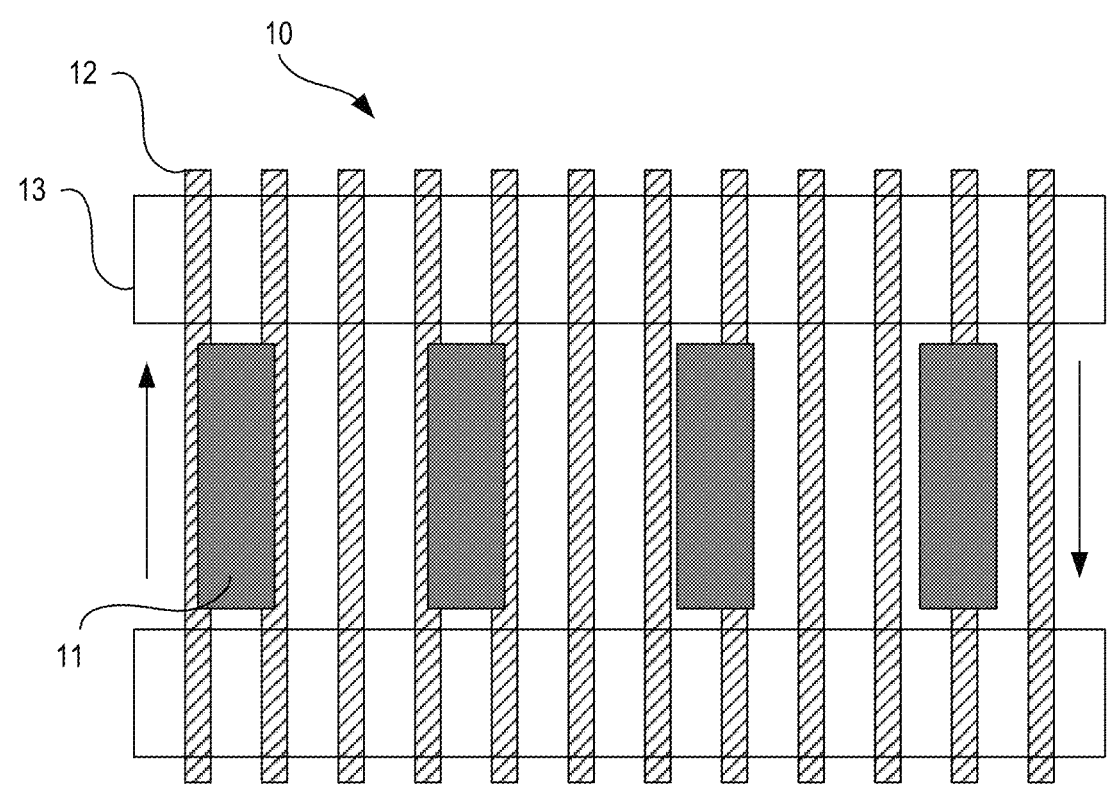
FIG. 5 illustrates a target according to an embodiment of the present disclosure.

FIG. 5 is an example embodiment of such an overlay target 10. Overlay target 10 may comprise a bottom grating structure 12, a top grating structure 11, and region of interest 13 that is used to capture both the position and the signal profile of the bottom grating structure 12. This can be used as the $SE_1$ or $SE_2$ in Equation 1. A target design that captures the device effects and process steps can have pitch ranges from a 40 nm fine pitch to a 200 and 400 nm coarse pitch. The total target size can be 1 μm to a few microns (e.g., 2-4 μm).

Figure 6:
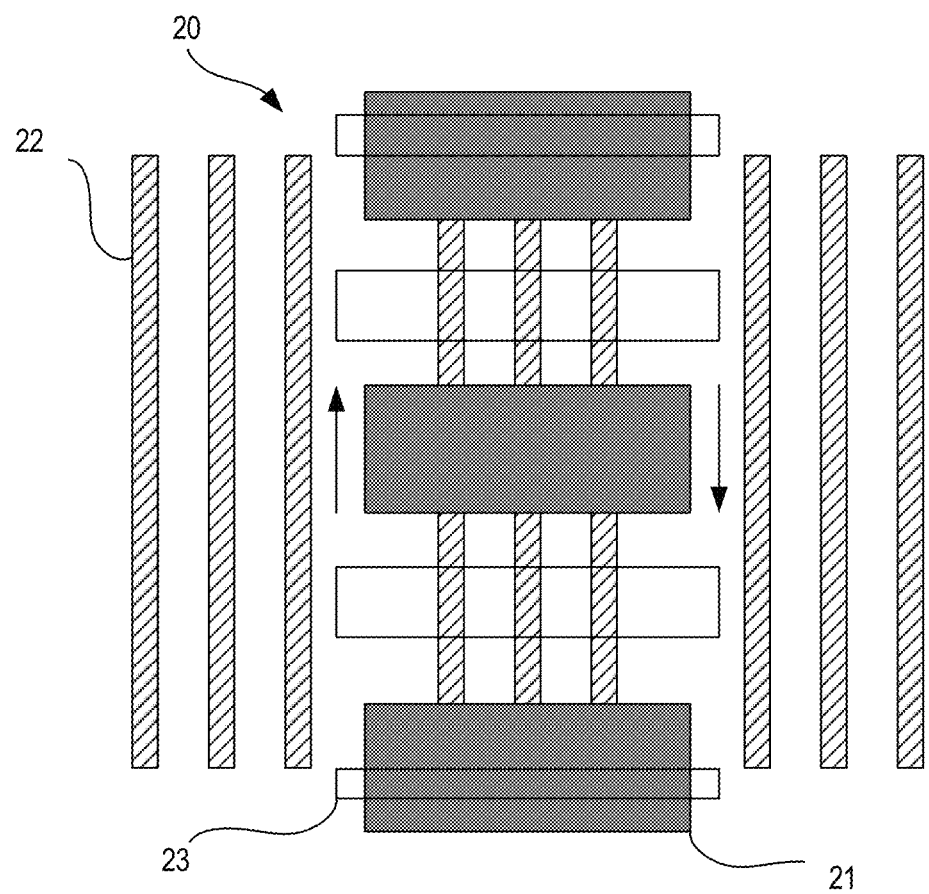
FIG. 6 illustrates a target according to an embodiment of the present disclosure.

FIG. 6 is an example embodiment of such an overlay target 20. Overlay target 10 may comprise a bottom grating structure 22, a top grating structure 21, and a region of interest 23. Pitches and target size for the embodiment of FIG. 6 may be similar to that of FIG. 5. The calibration area can be 200 nm or less.

Figure 7:
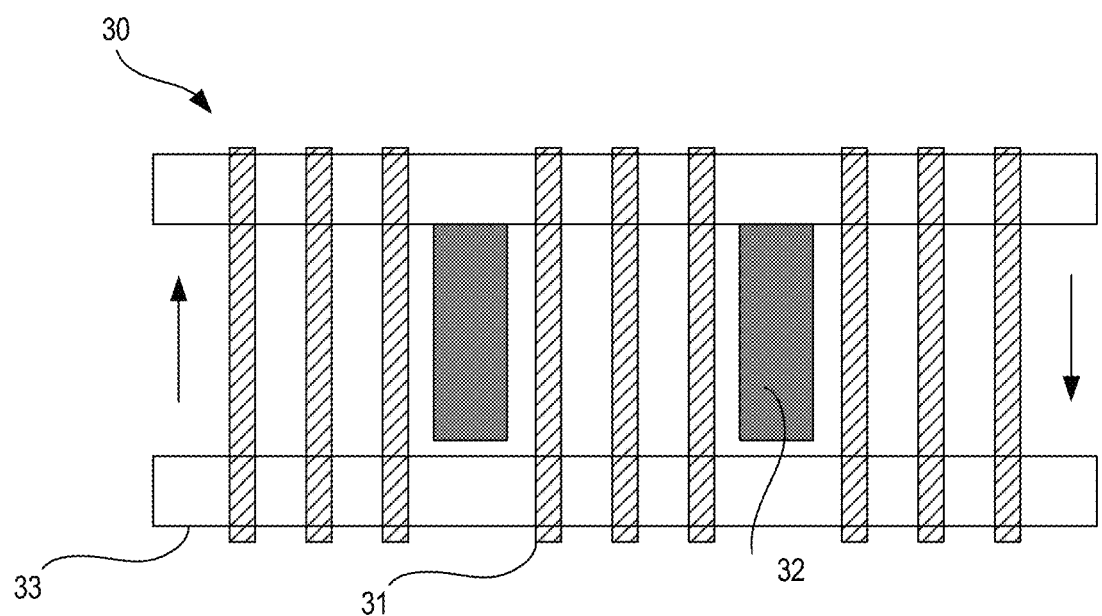
FIG. 7 illustrates a target according to an embodiment of the present disclosure.

FIG. 7 is an example embodiment of such an overlay target 30. Overlay target 10 may comprise a bottom grating structure 32 a top grating structure 31, and region of interest 33. Pitches and target size for the embodiment of FIG. 7 may be similar to that of FIG. 5. The calibration area can be 200 nm or less.

In some embodiments, a transparent resist may be used, and the BSE channel may be used as the seed for the method. If transparent resist is used, the overlay target may have open areas or may not have open areas. In an example with transparent resist, the overlay target has two open areas, such as the two rectangles in FIG. 5 around the region of interest 13.

The grating-over-grating structure may include a bottom grating structure and a top grating structure. The bottom grating structure may be disposed on a specimen. The specimen may be on a stage. The top grating structure may be disposed on the bottom grating structure. The calibration scan location may include the bottom grating structure but not the top grating structure. In some embodiments, the calibration scan location may consist essentially of the bottom grating structure. The overlay scan location may include the bottom grating structure and the top grating structure.

The grating-over-grating structure may include an open area. The open area may include neither the bottom grating structure nor the top grating structure. As such, the open area can be used for calibration. In an instance, the open area can be the location where the single grating signature is captured, which helps solve the Equations disclosed herein.

Figure 8:
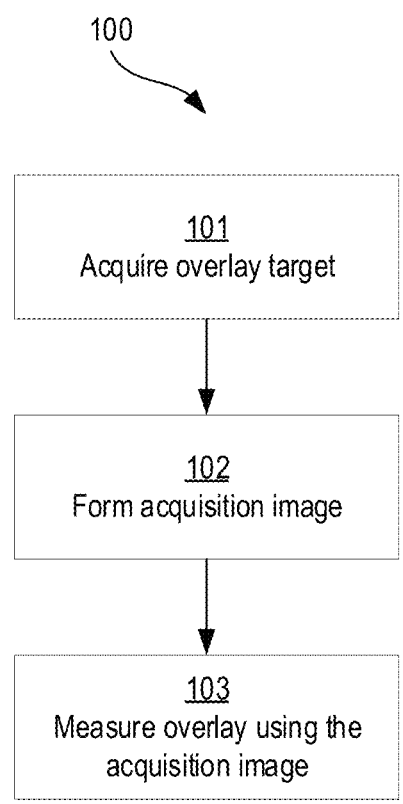
FIG. 8 illustrates an embodiment method according to the present disclosure.

In an instance, with reference to FIG. 8, a method 100 may comprise acquiring an overlay target at 101 with an electron beam-based output acquisition subsystem thereby forming an acquisition image at 102 and measuring an overlay of the grating-over-grating structure using the acquisition image at 103. The overlay target may comprise a grating-over-grating structure, a calibration scan location, and an overlay scan location. Measuring the overlay of the grating-over-grating structure at 103 using the acquisition image may comprise solving and extracting the overlay from the acquisition image.

The solving and extracting may comprise extracting an extracted signal from a single layer, such as by modeling the profile. This can be the projection of the 2D region of interest marked as a frame area in FIGS. 5-7.

The method may further comprise improving a signal-to-noise ratio of the extracted signal. In an instance, design-based filtering is applied. This is a filtering algorithm that incorporates the information of the design reference. Improving signal-to-noise ratio is described in U.S. Pat. Nos. 7,274,814 and 7,068,833, which are incorporated by reference in their entireties.

The improving may comprise applying a design-based filter to the extracted signal. This can be useful if the uncontaminated region is small. In an instance, a known fine and coarse pitch, either in 1D or 2D, is used. The target designer can provide the design parameters. When extracting the profile, anything that does not follow the design is noise and is removed, which improves signal-to-noise ratio.

Solving and extracting may further comprise solving a scattering of the extracted signal. The scattering may be solved by applying the BSE profile to Equation 2 or Equation 3.

Solving the scattering may comprise applying a backscattered electron profile to the extracted signal, determining a transfer function for the extracted signal, and generating a model for the scattering comprising the transfer function. The transfer function may be exemplified in Equation 4.

A parameter of the model may be optimized using a center of symmetry of the secondary electron signal or a local asymmetry. A parameter of the model may be optimized by matching the calibration scan location with a second calibration scan location for which an interaction between backscattered electrons and secondary electrons of a specific layer can be found.

Physical properties may be used to optimize the parameter of the scattered model. For example, the center of symmetry of the full SE signal may be used. A center of symmetry is the assumption that the designer of the target must follow. This assumption can be used when solving a scattering problem. The symmetry can break when grating-over-grating is placed. Hence, the algorithm can be constrained such that each grating in to the equations is symmetric.

The local asymmetry (e.g., a qMerit function) may be used. Local asymmetry can occur when extracting periodic signals. Each period can still be asymmetric, such as disclosed in U.S. Pub. No. 2014/0060148, which is incorporated by reference in its entirety. qMerit can be used when solving the equations disclosed herein. A constraint can be used to be sure that the local asymmetry (qMerit) will be minimized per grating as input for the equations.

Matching open areas (calibration areas) for which the interaction between BSEs and SEs of a specific layer may be used, as represented by the function $f(SE_1(x), BSE(x+x_1))$ in Equation 4. After solving the equations disclosed herein, the signals found by constrains can be matched to open areas.

Figure 9A:
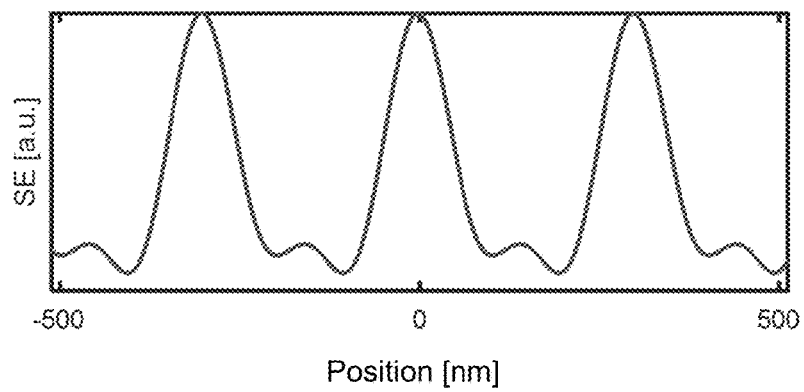
FIGS. 9A-9F illustrate graphic representations of signal contamination cleaning steps.
Figure 9B:
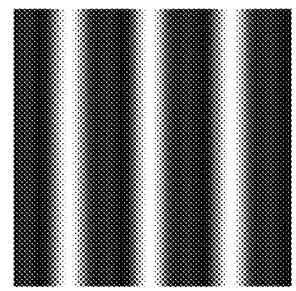
Figure 9C:
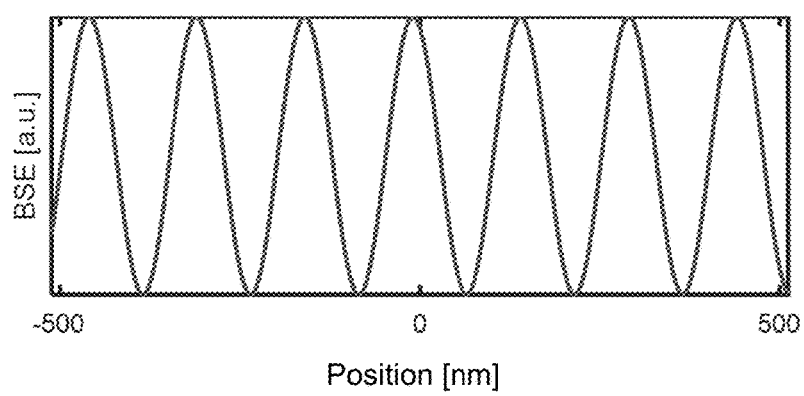
Figure 9D:
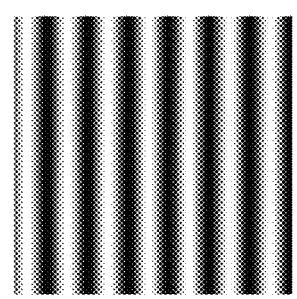
Figure 9E:
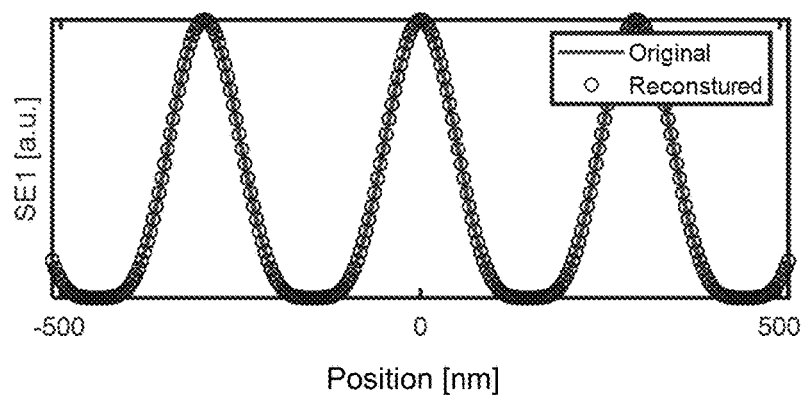
Figure 9F:
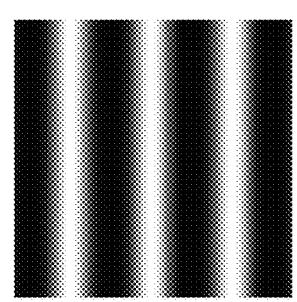

A signal contamination cleaning step is illustrated in FIGS. 9A-9F, which illustrate the process of solving the scattering problem. FIGS. 9A and 9B are the profile and the image, respectively. The profile is the 1D projection extracted from the image. As it is imaging a grating over grating both of the grating are visible. The two gratings are not aligned either by process overlay or by design. This misalignment causes the profile to by asymmetric even though they were process symmetrically. Following the procedure described in the embodiments disclosed herein, the profile and images of each layer are extracted. This is shown in FIGS. 9C and 9D and in FIGS. 9E and 9F as the top and bottom grating, respectively. The profile is shown as a projection and images are reconstructed symmetrically.

Figure 10:
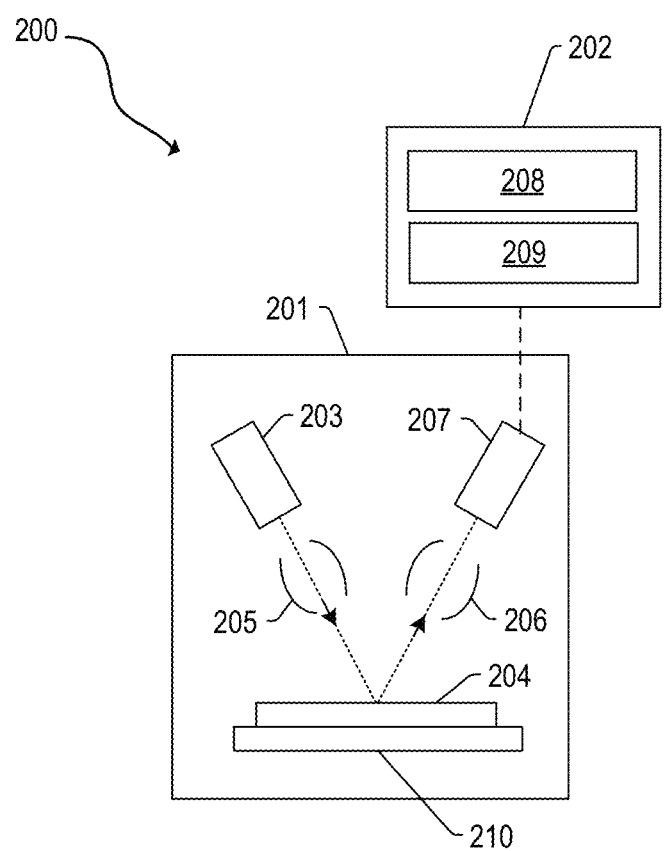
FIG. 10 illustrates an embodiment system according to the present disclosure.

FIG. 10 is a block diagram of an embodiment of a system 200. The system 200 includes a wafer inspection tool (which includes the electron column 201) configured to generate images of a wafer 204.

The wafer inspection tool may include an output acquisition subsystem that includes at least an energy source and a detector (e.g., an electron beam-based output acquisition subsystem). The output acquisition subsystem may be an electron beam-based output acquisition subsystem. For example, in one embodiment, the energy directed to the wafer 204 includes electrons, and the energy detected from the wafer 204 includes electrons. It is noted that wafer 204 may be a specimen. In this manner, the energy source may be an electron beam source. In one such embodiment shown in FIG. 10, the output acquisition subsystem may include electron column 201, which may be coupled to computer subsystem 202. A stage 210 may hold the wafer 204.

The wafer 204 may include an overlay target. The overlay target may comprise a grating-over-grating structure, a calibration scan location, and an overlay scan location.

As also shown in FIG. 10, the electron column 201 may include an electron beam source 203 configured to generate electrons that are focused to wafer 204 by one or more elements 205. The electron beam source 203 may include, for example, a cathode source or emitter tip. The one or more elements 205 may include, for example, a gun lens, an anode, a beam limiting aperture, a gate valve, a beam current selection aperture, an objective lens, and a scanning subsystem, all of which may include any such suitable elements known in the art.

Electrons returned from the wafer 204 (e.g., secondary electrons) may be focused by one or more elements 206 to detector 207. One or more elements 206 may include, for example, a scanning subsystem, which may be the same scanning subsystem included in element(s) 205.

The electron column 201 also may include any other suitable elements known in the art.

Although the electron column 201 is shown in FIG. 10 as being configured such that the electrons are directed to the wafer 204 at an oblique angle of incidence and are scattered from the wafer 204 at another oblique angle, the electron beam may be directed to and scattered from the wafer 204 at any suitable angles. In addition, the electron beam-based output acquisition subsystem may be configured to use multiple modes to generate images of the wafer 204 (e.g., with different illumination angles, collection angles, etc.). The multiple modes of the electron beam-based output acquisition subsystem may be different in any image generation parameters of the output acquisition subsystem.

Computer subsystem 202 may be coupled to detector 207 as described above. The detector 207 may detect electrons returned from the surface of the wafer 204 thereby forming electron beam images of the wafer 204. The electron beam images may include any suitable electron beam images. Computer subsystem 202 may be configured to perform any of the functions described herein using the output of the detector 207 and/or the electron beam images. Computer subsystem 202 may be configured to perform any additional step(s) described herein. A system 200 that includes the output acquisition subsystem shown in FIG. 10 may be further configured as described herein.

It is noted that FIG. 10 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system.

In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 10 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 202 includes a processor 208 and an electronic data storage unit 209. The processor 208 may include a microprocessor, a microcontroller, or other devices.

The computer subsystem 202 may be coupled to the components of the system 200 in any suitable manner (e.g., via one or more transmission media, which may include wired and/or wireless transmission media) such that the processor 208 can receive output. The processor 208 may be configured to perform a number of functions using the output. The wafer inspection tool can receive instructions or other information from the processor 208. The processor 208 and/or the electronic data storage unit 209 optionally may be in electronic communication with another wafer inspection tool, a wafer metrology tool, or a wafer review tool (not illustrated) to receive additional information or send instructions.

The processor 208 is in electronic communication with the wafer inspection tool, such as the detector 207. The processor 208 may be configured to process images generated using measurements from the detector 207. For example, the processor may perform embodiments of the method 100.

The computer subsystem 202, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 208 and electronic data storage unit 209 may be disposed in or otherwise part of the system 200 or another device. In an example, the processor 208 and electronic data storage unit 209 may be part of a standalone control unit or in a centralized quality control unit. Multiple processors 208 or electronic data storage units 209 may be used.

The processor 208 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 208 to implement various methods and functions may be stored in readable storage media, such as a memory in the electronic data storage unit 209 or other memory.

If the system 200 includes more than one computer subsystem 202, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 208 may be configured to perform a number of functions using the output of the system 200 or other output. For instance, the processor 208 may be configured to send the output to an electronic data storage unit 209 or another storage medium. The processor 208 may be further configured as described herein.

The processor 208 or computer subsystem 202 may be part of a defect review system, an inspection system, a metrology system, or some other type of system. Thus, the embodiments disclosed herein describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 208 may be configured according to any of the embodiments described herein. The processor 208 also may be configured to perform other functions or additional steps using the output of the system 200 or using images or data from other sources.

In an instance, the processor 208 may be in communication with the system 200. The processor 208 may be configured to measure an overlay of the grating-over-grating structure using the acquisition image. The processor 208 may be further configured to measure an overlay of the grating-over-grating structure using the acquisition image by solving and extracting the overlay from the acquisition image.

The processor 208 may be communicatively coupled to any of the various components or sub-systems of system 200 in any manner known in the art. Moreover, the processor 208 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 208 and other subsystems of the system 200 or systems external to system 200.

In an instance, a non-transitory computer-readable storage medium may comprise one or more programs for executing the steps of the method, for example, method 100 acquiring an overlay target with an electron beam-based output acquisition subsystem thereby forming an acquisition image and measuring an overlay of the grating-over-grating structure using the acquisition image. The steps may further include solving and extracting the overlay from the acquisition image.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 208 (or computer subsystem 202) or, alternatively, multiple processors 208 (or multiple computer subsystems 202). Moreover, different sub-systems of the system 200 may include one or more computing or logic systems. Therefore, the above description should not be interpreted as a limitation on the present disclosure but merely an illustration.

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments, it will be understood that other embodiments of the present disclosure may be made without departing from the scope of the present disclosure.

What is claimed is:

1. A method, comprising:
    acquiring an overlay target with an electron beam-based output acquisition subsystem thereby forming an acquisition image, wherein the overlay target comprises:
        a grating-over-grating structure including:
            a bottom grating structure; and
            a top grating structure disposed on the bottom grating structure;
        a calibration scan location including the bottom grating structure but not the top grating structure; and
        an overlay scan location including the top grating structure and the bottom grating structure; and
    measuring an overlay of the grating-over-grating structure by solving and extracting the overlay from the acquisition image, wherein the solving and extracting comprises extracting an extracted signal from a single layer, wherein the solving and extracting further comprises solving a scattering of the extracted signal, and wherein solving the scattering comprises:
        applying a backscattered electron profile to the extracted signal;
        determining a transfer function for the extracted signal; and
        generating a model for the scattering comprising the transfer function.

2. The method of claim 1, further comprising improving a signal-to-noise ratio of the extracted signal.

3. The method of claim 2, wherein the improving comprises applying a design-based filter to the extracted signal.

4. The method of claim 1, wherein a parameter of the model is optimized using a center of symmetry of a secondary electron signal or a local asymmetry, or by matching the calibration scan location with a second calibration scan location for which an interaction between backscattered electrons and secondary electrons of a specific layer is found.

5. A non-transitory computer-readable storage medium, comprising one or more programs for executing the method of claim 1 on one or more computing devices.

6. A system, comprising:
    a stage configured to hold a specimen having an overlay target, wherein the overlay target comprises a grating-over-grating structure including:

a bottom grating structure disposed on the specimen; and
a top grating structure disposed on the bottom grating structure;
a calibration scan location including the bottom grating structure but not the top grating structure; and
an overlay scan location including the top grating structure and the bottom grating structure; and
an electron beam-based output acquisition subsystem configured to measure the overlay target on the stage; and
a processor in electronic communication with the electron beam-based output acquisition subsystem configured to measure an overlay of the grating-over-grating structure by solving and extracting the overlay from an acquisition image, wherein the solving and extracting comprises extracting an extracted signal from a single layer, wherein the solving and extracting further comprises solving a scattering of the extracted signal, and wherein solving the scattering comprises:

applying a backscattered electron profile to the extracted signal;
determining a transfer function for the extracted signal; and
generating a model for the scattering comprising the transfer function.

7. The system of claim 6, further comprising improving a signal-to-noise ratio of the extracted signal using the processor.

8. The system of claim 7, wherein the improving comprises applying a design-based filter to the extracted signal.

9. The system of claim 6, wherein a parameter of the model is optimized using a center of symmetry of the a secondary electron signal or a local asymmetry or by matching the calibration scan location with a second calibration scan location for which an interaction between backscattered electrons and secondary electrons of a specific layer is found.

* * * * *